United States Patent
Akahori

(10) Patent No.: US 7,639,036 B2
(45) Date of Patent: Dec. 29, 2009

(54) SEMICONDUCTOR INTEGRATED CIRCUIT

(75) Inventor: Akira Akahori, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/175,478

(22) Filed: Jul. 18, 2008

(65) Prior Publication Data

US 2009/0066362 A1 Mar. 12, 2009

(30) Foreign Application Priority Data

Sep. 11, 2007 (JP) .............................. 2007-235165

(51) Int. Cl.
*H03K 19/00* (2006.01)
(52) U.S. Cl. ................................ 326/16; 326/9; 326/14
(58) Field of Classification Search ...................... 326/9, 326/14–16
See application file for complete search history.

(56) References Cited

U.S. PATENT DOCUMENTS

2005/0122297 A1* 6/2005 Imagawa et al. .............. 345/89

2006/0061376 A1* 3/2006 Van De Logt et al. ........ 324/763

FOREIGN PATENT DOCUMENTS

| JP | 05-275621 | 10/1993 |
|---|---|---|
| JP | 11-237441 | 8/1999 |
| JP | 2000-193709 | 7/2000 |

\* cited by examiner

*Primary Examiner*—Anh Q Tran
(74) *Attorney, Agent, or Firm*—Volentine & Whitt, P.L.L.C.

(57) ABSTRACT

A semiconductor integrated circuit having a test circuit for inspecting states of connections between a plurality of pads and respective external terminals by bonding wires. The test circuit comprises, for each of a plurality of pads, a control terminal provided to receive a control signal of a logic level equal to the logic level of a signal applied to a corresponding one of the external terminals, an inverter which inverts the logic level on the control terminal, an inverted output terminal of the inverter being connected to the pad via a connection line; and an exclusive-NOR gate which outputs an exclusive NOR of the logic level on the connection line and the logic level on the control terminal.

6 Claims, 5 Drawing Sheets

SEMICONDUCTOR INTEGRATED CIRCUIT

BACKGROUND OF THE INVENTION

1. Field of the Invention

The present invention relates to a semiconductor integrated circuit having a function to inspect the connection states of bonding wires between pads of the chip of the integrated circuit and external terminals of a package housing the chip.

2. Description of the Related Background Art

A semiconductor integrated circuit comprises an integrated circuit chip made of a semiconductor or the like having an integrated circuit formed thereon and a package housing the integrated circuit chip. A plurality of pads for input from/output to the outside such as power supply pads, ground pads, and signal pads are formed on the integrated circuit chip and connected by bonding wires to external terminals, called leads or pins, provided in the package housing the integrated circuit chip. With these bonding wires, a bonding failure may occur where a bonding wire is debonded to be open or is shorted to an adjacent external terminal depending on the wire connection state resulting from the bonding process of semiconductor integrated circuit manufacturing. In order to deal with the bonding failure, semiconductor integrated circuits are usually inspected for bonding failures in a test process.

As semiconductor integrated circuits become larger in scale, more external terminals are formed in the semiconductor integrated circuit, and hence a test circuit is formed therein to efficiently determine the occurrence of a bonding failure with a wire between an external terminal and a pad for each external terminal (see Japanese Patent Application Laid-Open Publications No. H05-275621 (hereinafter called Reference 1), No. H11-237441, and No. 2000-193709).

FIG. 1 shows a test circuit for a semiconductor integrated circuit shown in Reference 1, and FIG. 2 shows a time chart for the circuit of FIG. 1. In the test circuit, when a first logical pattern of 0, 1, 0, and 1 is input to external terminals S1, S2, S3, and S4 to be inspected for a bonding failure, if all the external terminals S1, S2, S3, and S4 have a wire normally bonded thereto, all PMOS transistors P1, P2, P3, and P4 become ON, and thus a high level of a power supply voltage Vdd is transmitted to a node M. Hence 1 is latched into a latch circuit 3. Meanwhile, at this time all NMOS transistors N1, N2, N3, and N4 become OFF, and thus a node N becomes a high level of the power supply voltage Vdd which corresponds to logic n "1" because of the operation of a pull-up circuit. Hence 0 is latched into a latch circuit 4. Therefore an AND circuit 5 for outputting an STM signal that indicates a test result outputs the STM signal of zero regardless of an external test start signal ST. When a second logical pattern of 1, 0, 1, and 0 that is the opposite of the first logical pattern is subsequently input to the external terminals S1, S2, S3, and S4, the NMOS transistors N1, N2, N3, and N4 become ON, so that the node N becomes a ground level which corresponds to logic "0", and thus a zero is input to an inverter 6 and its inverted output of "1" is latched into the latch circuit 4. The PMOS transistors P1, P2, P3, and P4 become OFF, and thus the node M becomes the ground level because of the operation of a pull-down circuit 1. However, because an SR signal="L", the latched value of the latch circuit 3 does not change but remains "1". Because the ST signal is at "1", the STM signal, which is the output signal, becomes "1". Therefore, if the external terminals S1, S2, S3, and S4 have a wire normally bonded thereto, as a result of inputting the two patterns, the STM signal becomes "1". On the other hand, in a bonding failure case where any of the external terminals S1, S2, S3, and S4 has a wire not normally bonded thereto, one or more of the PMOS transistors P1, P2, P3, P4 and the NMOS transistors N1, N2, N3, N4 do not become ON. Hence for the first logical pattern, the level on the node M is pulled down to "0", so that "0" is latched into the latch circuit 3, and for the second logical pattern, the level on the node N is pulled up to "1" by the pull-up circuit 2, so that the inverted output of "0" is latched into the latch circuit 4. In this case, as a result of inputting the two patterns, the STM signal becomes "0". The semiconductor integrated circuit can be determined to be good when the STM signal="1" as a result of inputting the two patterns and to be defective in bonding when the STM signal="0".

In the above conventional test circuit, an external-terminal open/short state in the integrated circuit can be realized by inputting a predetermined terminal check control signal to the external terminals, and only when normal, the STM signal becomes "1", thus producing the effect of reducing terminal test time for semiconductor integrated circuits with multiple external terminals. However, because the terminal check control signal of the two patterns has to be input, there is the drawback that the test sequence is complex. Furthermore, in LSIs (large scale integrated circuits) such as memories, particular pads thereof may be connected to power supply terminals or ground terminals of external terminals to fix an operation mode, in manufacturing. For the logically-fixed pads whose potentials are fixed, two patterns cannot be input in test as above, and hence there is a problem in that correct inspection cannot be performed in the conventional test circuit.

SUMMARY OF THE INVENTION

An object of the present invention is to provide a semiconductor integrated circuit having pads whose logic levels are to be fixed by applying potentials thereto through respective external terminals, wherein the states of bonding wire connections between the respective external terminals and the pads can be efficiently inspected.

According to the present invention, there is provided a semiconductor integrated circuit having a plurality of pads to be connected by bonding wires to respective external terminals so that logic levels of signals applied to the external terminals are given to the plurality of pads, and a test circuit for inspecting states of connections between the plurality of pads and the respective external terminals, wherein the test circuit comprises: for each of the plurality of pads, a control terminal provided to receive a control signal of a logic level equal to the logic level of a signal applied to a corresponding one of the external terminals; an inverter which inverts the logic level on the control terminal, an inverted output terminal of the inverter being connected to the pad via a connection line; and an exclusive-NOR gate which is separately connected to the connection line and the control terminal, and outputs an exclusive NOR of the logic level on the connection line and the logic level on the control terminal, and wherein an output of the exclusive NOR indicates a test result of the connection state between the pad and the corresponding external terminal.

In the semiconductor integrated circuit of the present invention, the exclusive-NOR gate is comparing means, and the exclusive NOR output indicates whether the logic level on the connection line and the logic level on the control terminal are equal to each other. If the state of the bonding wire connection between the pad and the corresponding external terminal is normal, the exclusive-NOR gate outputs, e.g., logic "0" indicating the logic levels which are equal. On the other hand, if the bonding wire connection is defective, the exclusive-NOR gate outputs, e.g., logic "1" indicating the logic levels which are different. The logic "1" output is produced even if the pad is a logically-fixed pad to be fixed to one of the logic levels. Thus, the states of bonding wire connections between the external terminals and the respective pads can be efficiently inspected.

DETAILED DESCRIPTION OF THE INVENTION

An embodiment according to the present invention will be described in detail below with reference to the drawings.

Figure 1:
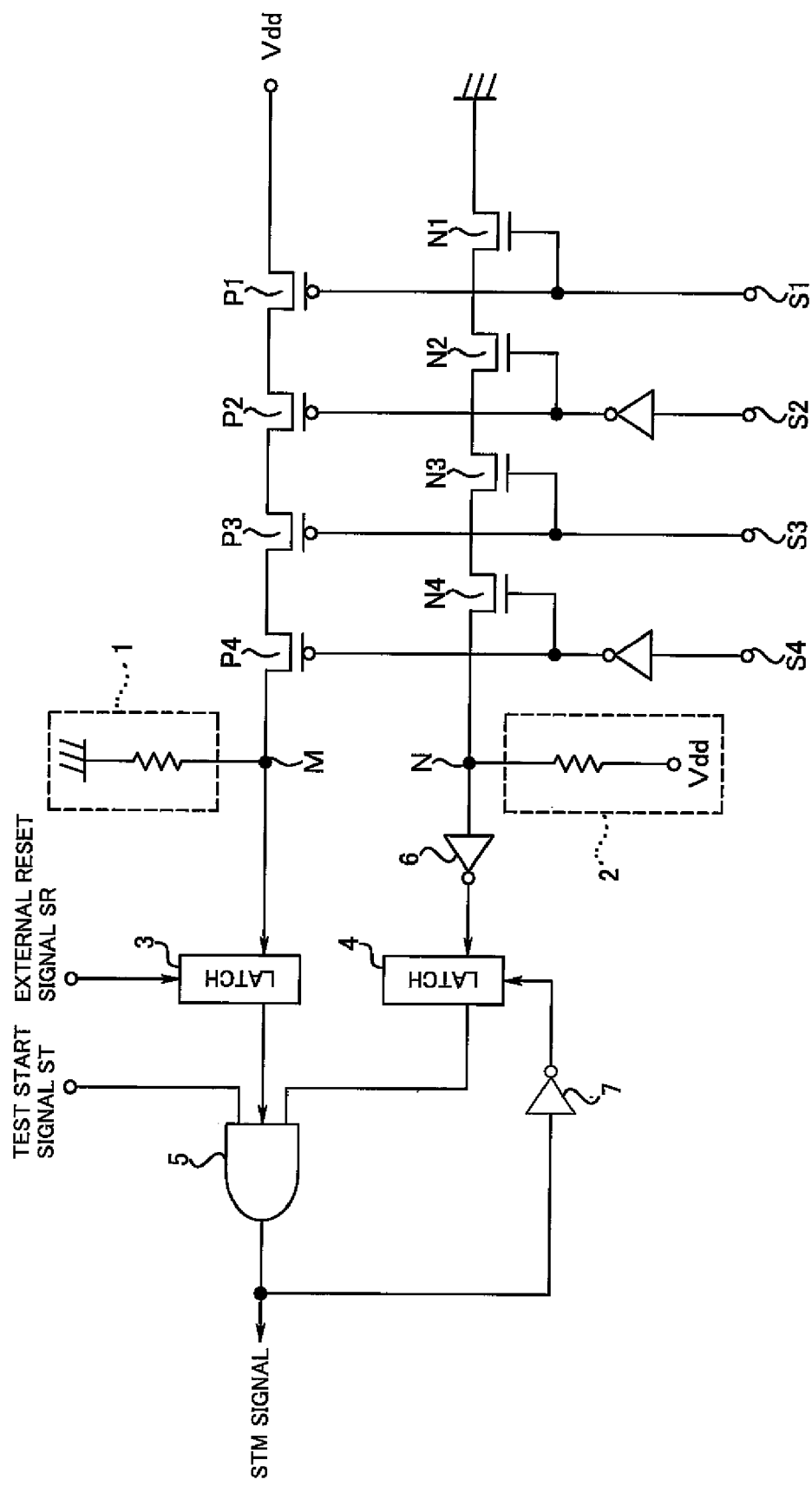
FIG. 1 is a circuit diagram of a conventional semiconductor integrated circuit having a function to inspect for a pad bonding failure.
Figure 2:
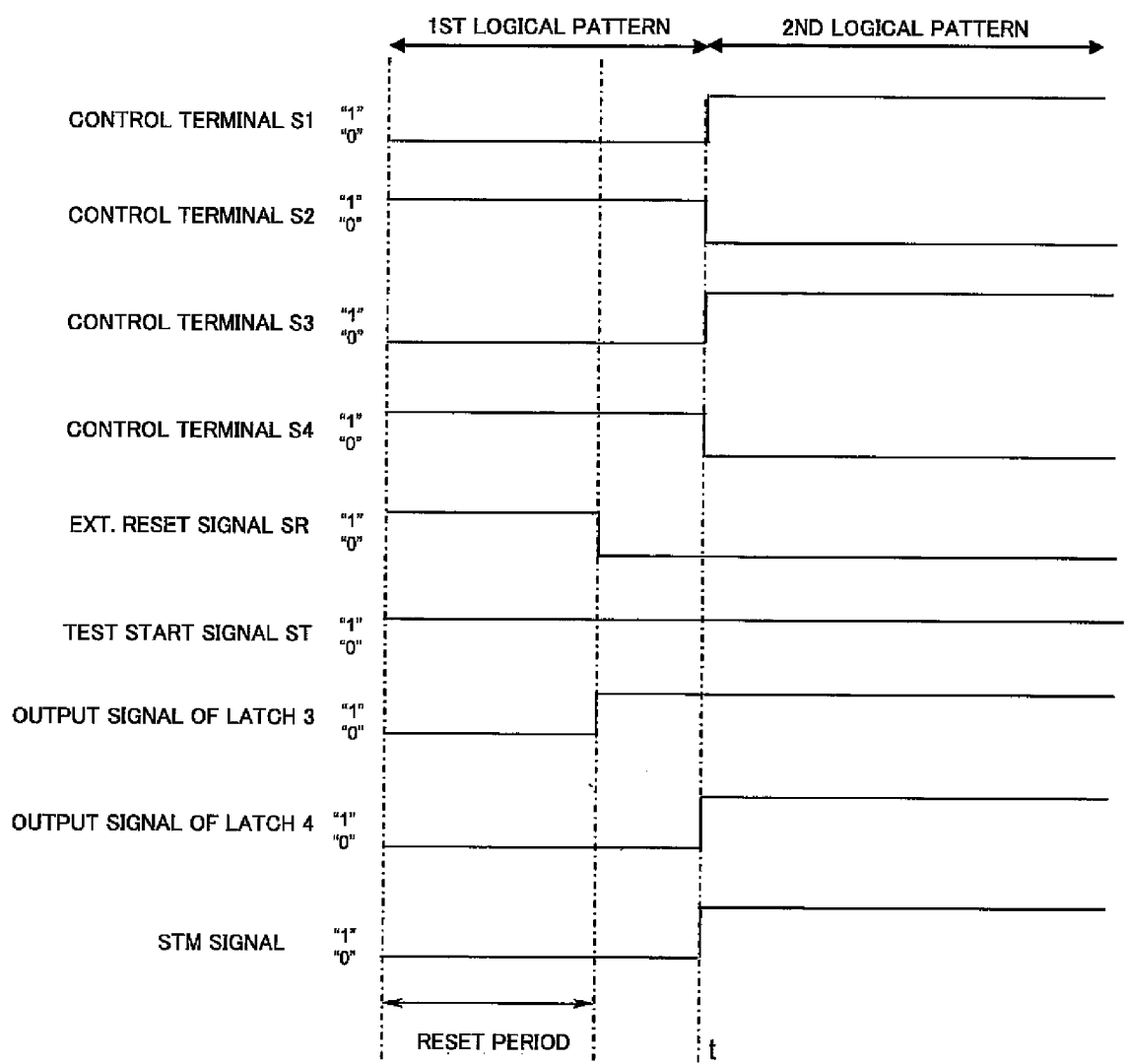
FIG. 2 is a time chart showing the voltage waveform of each part of the circuit of FIG. 1 when being inspected.
Figure 3:
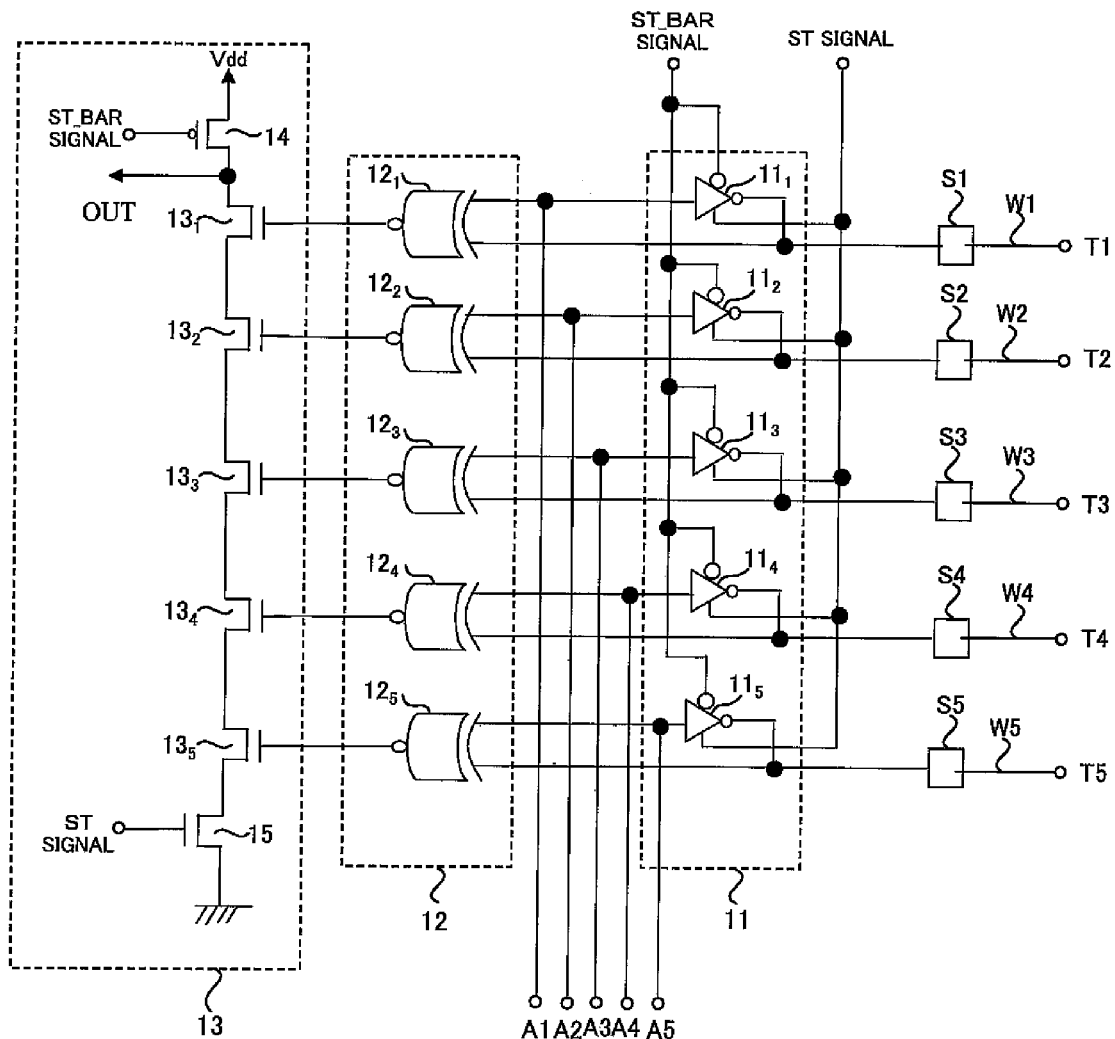
FIG. 3 is a circuit diagram showing an embodiment of the present invention.

FIG. 3 shows the circuit configuration of a semiconductor integrated circuit according to the present invention. The semiconductor integrated circuit comprises external terminals T1 to T5, logically-fixed pads S1 to S5, control terminals A1 to A5, a TRIINV circuit 11, an exclusive-NOR circuit 12, and a NAND circuit 13. The TRIINV circuit 11, the exclusive-NOR circuit 12, and the NAND circuit 13 form a test circuit.

The external terminals T1 to T5 are constituted by, e.g., pins formed in a package (not shown) of the semiconductor integrated circuit. The external terminals T1 to T5 and the logically-fixed pads S1 to S5 are connected respectively by bonding wires W1 to W5 if bonding is normally performed.

The logically-fixed pads S1 to S5 are pads to be logically fixed to determine, e.g., the operation mode of the semiconductor integrated circuit. A power supply potential Vdd or a ground level Vss is applied to each of the logically-fixed pads S1 to S5 via the bonding wire W1 to W5 through the external terminal T1 to T5 if bonding has been normally performed. The potential Vdd corresponds to a high level indicating logic "1", and the ground level Vss corresponds to a low level indicating logic "0".

Figure 4:
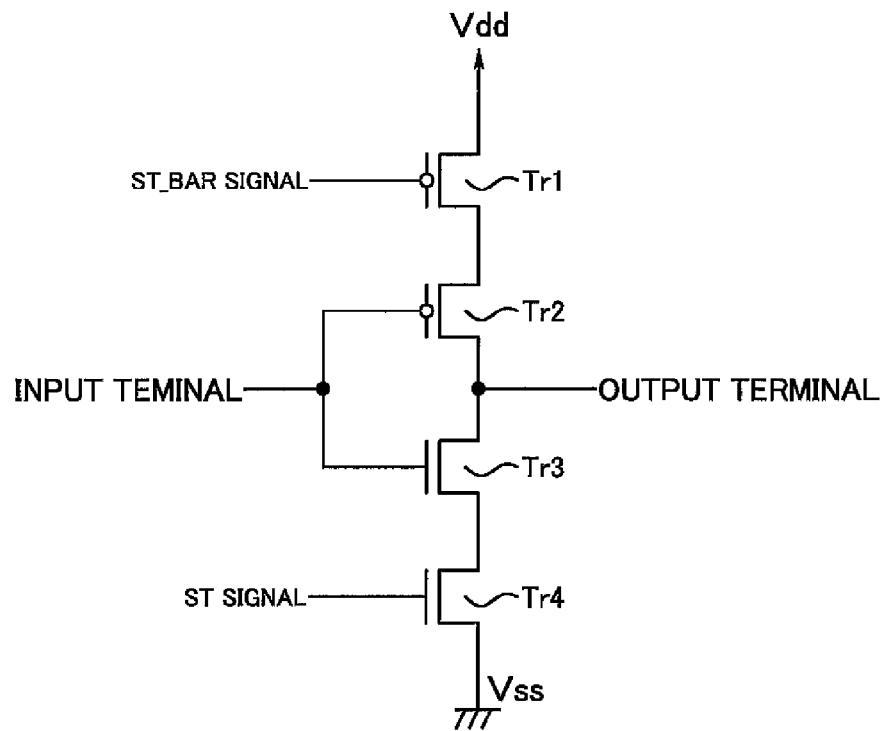
FIG. 4 is a circuit diagram showing the specific configuration of an inverter in the circuit of FIG. 3.

The TRIINV circuit 11 comprises inverters 111 to 115 having two control terminals, one of which is supplied with an ST_BAR signal and the other is supplied with an ST signal. The ST_BAR signal and the ST signal are test signals that are supplied in inspecting for a bonding failure. The ST_BAR signal is an inverted signal of the ST signal. Each of the inverters 111 to 115 comprises, e.g., PMOS transistors Tr1, Tr2 and NMOS transistors Tr3, Tr4 as shown in FIG. 4.

The exclusive-NOR circuit 12 comprises exclusive-NOR gates 121 to 125. One input terminals of the exclusive-NOR gates 121 to 125 are respectively connected to the input terminals of the inverters 111 to 115, and these connections are also connected to the control terminals A1 to A5. Control signals are supplied to the control terminals A1 to A5. The other input terminals of the exclusive-NOR gates 121 to 125 are respectively connected to the output terminals of the inverters 111 to 115 and to the logically-fixed pads S1 to S5.

The NAND circuit 13 comprises NMOS transistors 131 to 135, a PMOS transistor 14, and an NMOS transistor 15. The NMOS transistors 131 to 135 are serially connected in a drain-to-source connection. The gates of the NMOS transistors 131 to 135 are respectively connected to the output terminals of the exclusive-NOR gates 121 to 125. The potential Vdd is applied to the source of the PMOS transistor 14, the drain of which is connected to the drain of the NMOS transistors 131. Further, the ST_BAR signal is supplied to the gate of the PMOS transistor 14. The NMOS transistor 15 is connected at the drain to the source of the NMOS transistors 135 and at the source to ground. The ST signal is supplied to the gate of the NMOS transistor 15. The connection between the drains of the NMOS transistors 131 and the PMOS transistor 14 is an AND inverted output OUT as a test result.

Next, as to the operation of the semiconductor integrated circuit with this configuration, the circuit test in the case where the external terminals T1 to T5 and the logically-fixed pads S1 to S5 are normally connected by bonding wires will be described. When the ST_BAR signal is set to the high level of "1" and the ST signal is set to the low level of "0", the TRIINV circuit 11 and the NAND circuit 13 are put in operation.

Control signals supplied to the control terminals A1 to A5 are of the same logical level as those on the respective external terminals T1 to T5. That is, if power supply potential Vdd is applied to the external terminal T1, the control signal on the control terminal A1 is set to potential Vdd, which both are at logic "1". If ground level Vss is applied to the external terminal T1, the control signal on the control terminal A1 is set to ground level Vss, which both are at logic "0".

Figure 5A:
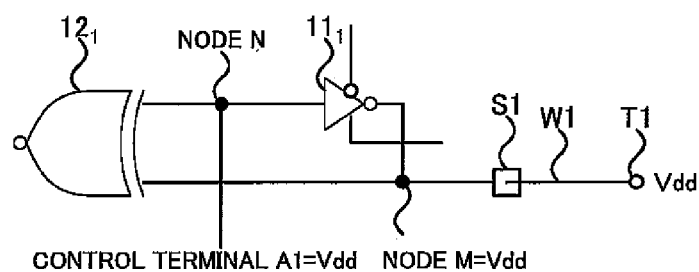
FIGS. 5A and 5B show the potential of a pad S1 normally connected by a bonding wire and the potential of each node.

FIG. 5A shows the potentials of a node M on the output side and a node N on the input side of the inverter 111 in the case where potential Vdd is applied to the pad S1 via the bonding wire W1 through the external terminal T1 and the control signal on the control terminal A1 is set at potential Vdd. In this case, the inverter 111 operates to pull the output level toward ground level Vss, but the potential of the node M becomes Vdd because the current that flows in through the external terminal T1 and the pad S1 to the node M is larger than the current that flows in from the node M through the NMOS transistors Tr3, Tr4 of the inverter 111. Thus, the potentials of the node M and of the node N are both at Vdd, i.e., logic "1" and supplied to the exclusive-NOR gate 121, and hence the exclusive-NOR gate 121 produces an output signal, of "1".

Figure 5B:
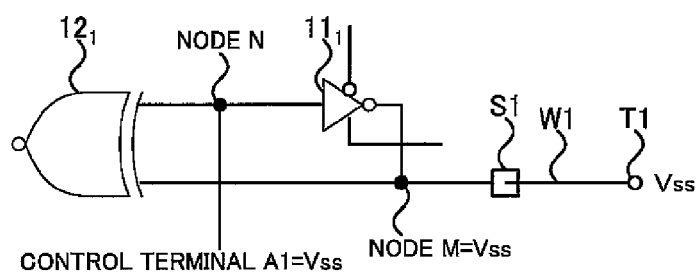

FIG. 5B shows the potentials of the node M on the output side and the node N on the input side of the inverter 111 in the case where ground level Vss is applied to the pad S1 via the bonding wire W1 through the external terminal T1 and the control signal on the control terminal A1 is set at ground level Vss. In this case, the inverter 111 operates to pull the output level toward potential Vdd, but the potential of the node M becomes ground level Vss because the current that flows from the node M through the pad S1 and the external terminal T1 is larger than the current that flows out from the node M through the PMOS transistors Tr1, Tr2 of the inverter 111. Thus, the potentials of the node M and of the node N are both at Vss, i.e., logic "0" and supplied to the exclusive-NOR gate 121, and hence the exclusive-NOR gate 121 produces an output signal of logic "1".

The operations shown in FIGS. 5A, 5B also apply to the pads S2 to S5. In the case where all the external terminals T1 to T5 and the logically-fixed pads S1 to S5 are normally connected by bonding wires respectively, each of the exclusive-NOR gates 121 to 125 produces an output signal of logic "1". In the NAND circuit 13, all the NMOS transistors 131 to 135 become ON in response to those output signals of logic "1". At this time, the PMOS transistor 14 is put in a high impedance state, and the NMOS transistor 15 becomes ON. Thus, the NAND circuit 13 produces an output signal of logic "0" that corresponds to ground level Vss. This output signal of logic "0" indicates that all the pads S2 to S5 are normally bonded to.

Figure 6A:
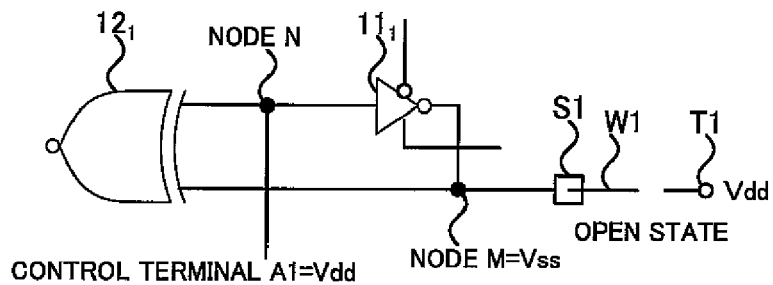
FIGS. 6A and 6B show the potential of the pad S1 that is open due to a bonding failure and the potential of each node.

Next, cases where the logically-fixed pad S1 to S5 is open or shorted due to a bonding failure will be described. FIG. 6A shows the potentials of the node M on the output side and the node N on the input side of the inverter 111 in the case where the pad S1 to which potential Vdd should be applied via the bonding wire W1 through the external terminal T1 is open while the control signal on the control terminal A1 is set at potential Vdd. In this case, the inverter 111 outputs ground level Vss, and hence the potential of the node M becomes ground level Vss. Thus, the ground level Vss corresponding to logic "0" and the control signal of potential Vdd on the control terminal A1, corresponding to logic "1", are supplied to the exclusive-NOR gate 121, and hence the exclusive-NOR gate 121 produces an output signal of logic "0".

Figure 6B:
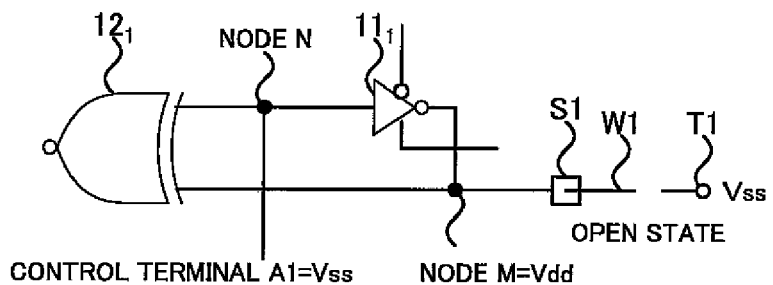

FIG. 6B shows the potentials of the node M on the output side and the node N on the input side of the inverter 111 in the case where the pad S1 to which ground level Vss should be applied via the bonding wire W1 through the external terminal T1 is open while the control signal on the control terminal A1 is set at ground level Vss. In this case, the inverter 111 outputs potential Vdd, and hence the potential of the node M becomes potential Vdd. Thus, the potential Vdd corresponding to logic "1" and the control signal of ground level Vss on the control terminal A1, corresponding to logic "0", are supplied to the exclusive-NOR gate 121, and hence the exclusive-NOR gate 121 produces an output signal of logic "0".

Figure 7A:
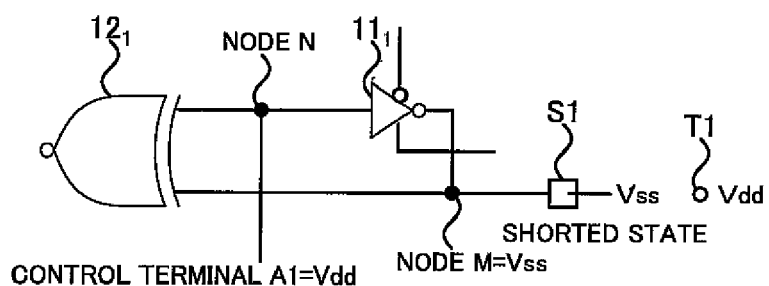
FIGS. 7A and 7B show the potential of the pad S1 that is shorted due to a bonding failure and the potential of each node.

FIG. 7A shows the potentials of the node M on the output side and the node N on the input side of the inverter 111 in the case where the pad S1 to which potential Vdd should be applied via the bonding wire W1 through the external terminal T1 is shorted to ground while the control signal on the control terminal A1 is set at potential Vdd. In this case, the inverter 111 outputs ground level Vss, and the potential of the node M becomes ground level Vss. Thus, the ground level Vss corresponding to logic "0" and the control signal of potential Vdd on the control terminal A1, corresponding to logic "1", are supplied to the exclusive-NOR gate 121, and hence the exclusive-NOR gate 121 produces an output signal of logic "0".

Figure 7B:
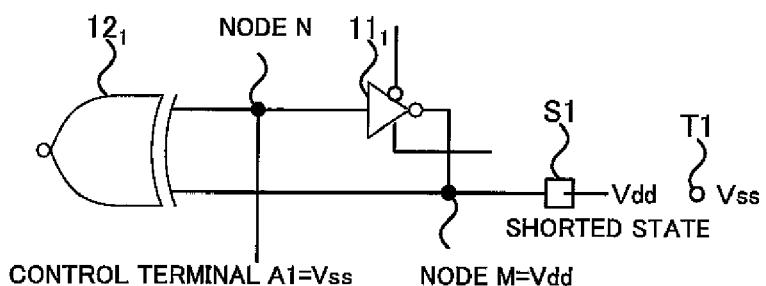

FIG. 7B shows the potentials of the node M on the output side and the node N on the input side of the inverter 111 in the case where the pad S1 to which ground level Vss should be applied via the bonding wire W1 through the external terminal T1 is shorted to a line of potential Vdd while the control signal on the control terminal A1 is set at ground level Vss. In this case, the inverter 111 outputs potential Vdd, and the potential of the node M becomes potential Vdd. Thus, the potential Vdd corresponding to logic "1" and the control signal of ground level Vss on the control terminal A1, corresponding to logic "0", are supplied to the exclusive-NOR gate 121, and hence the exclusive-NOR gate 121 produces an output signal of logic "0".

The operations shown in FIGS. 6A, 6B, 7A, and 7B also apply to the pads S2 to S5. If a bonding failure occurs with at least one of the pads S1 to S5, the exclusive-NOR gate 121 to 125 corresponding to the bonding-failed pad produces an output signal of logic "0". In the NAND circuit 13, the corresponding NMOS transistor 131 to 135 becomes OFF in response to the output signal of logic "0". Although at this time the other exclusive-NOR gates produce output signals of logic "1", the series connection of the NMOS transistors 131 to 135 goes into a high impedance state. Meanwhile, the PMOS transistor 14 is ON, and hence the NAND circuit 13 produces an output signal of logic "1" corresponding to potential Vdd. This output signal of logic "1" indicates that there is a bonding failure with at least one of the pads S1 to S5.

Therefore, when inputting control signals of logic values equal to the logic values of the signals which should be applied respectively to a plurality of pads of a semiconductor integrated circuit, a desired logic output such as the above output signal of logic "0" is not obtained unless all the plurality of pads are normally bonded to. Hence, even if there are multiple pads having their logic individually fixed at "0" or "1", the bonding connection states of pads to external terminals can be inspected efficiently and accurately.

The present invention can be applied not only to semiconductor integrated circuits provided with pads having their logic level fixed but also to semiconductor integrated circuits provided with pads variable in logic level wherein the logic levels of control signals to be applied to control terminals are changed according to changes in logic levels to be applied to the pads.

This application is based on Japanese Patent Application No. 2007-235165 which is hereby incorporated by reference.

What is claimed is:

1. A semiconductor integrated circuit having a plurality of pads to be connected by bonding wires to respective external terminals so that logic levels of signals applied to said external terminals are given to said plurality of pads, and a test circuit for inspecting states of connections between said plurality of pads and said respective external terminals, wherein said test circuit comprises: for each of said plurality of pads,
   a control terminal provided to receive a control signal of a logic level equal to the logic level of a signal applied to a corresponding one of said external terminals;
   an inverter which inverts the logic level on said control terminal, an inverted output terminal of said inverter being connected to the pad via a connection line; and
   an exclusive-NOR gate which is separately connected to said connection line and said control terminal, and outputs an exclusive NOR of the logic level on said connection line and the logic level on said control terminal, and wherein an output of the exclusive NOR indicates a test result of the connection state between the pad and the corresponding external terminal.

2. The semiconductor integrated circuit according to claim 1, wherein said test circuit further comprises a NAND circuit which produces an inverted value of a logical product of the outputs of the respective exclusive-NOR gates for said plurality of pads.

3. The semiconductor integrated circuit according to claim 1, wherein when the logic level on said control terminal and the logic level on the pad are equal, said inverter operates so that the logic level on said connection line becomes equal to the logic level on the pad.

4. The semiconductor integrated circuit according to claim 1, wherein when the connection state between the pad and the corresponding external terminal is a normal state, a logic level of said connection line is different from a output level of said inverter and said exclusive-NOR gate produces a high level output.

5. The semiconductor integrated circuit according to claim 1, wherein when the connection state between the pad and the corresponding external terminal is an open state, a logic level of said connection line is equal to a output level of said inverter and said exclusive-NOR gate produces a low level output.

6. The semiconductor integrated circuit according to claim 1, wherein when the connection state between the pad and the corresponding external terminal is a shorted state, a logic level of said connection line is equal to a output level of said inverter and said exclusive-NOR gate produces a low level output.

* * * * *